United States Patent [19]
Petri

[11] 3,909,679
[45] Sept. 30, 1975

[54] CABINET AND HEAT SINK FOR AMPLIFIER COMPONENTS

[75] Inventor: Ralph E. Petri, Chicago, Ill.

[73] Assignee: Rock-Ola Manufacturing Corporation, Chicago, Ill.

[22] Filed: Nov. 7, 1974

[21] Appl. No.: 521,798

[52] U.S. Cl. ............ 317/100; 174/DIG. 5; 325/352
[51] Int. Cl.² ............ H05K 7/20
[58] Field of Search ........ 330/65, 68; 325/352, 353, 325/357; 174/DIG. 5, 15 R, 16 R; 317/117, 120, 100

[56] References Cited

UNITED STATES PATENTS

| | | | |
|---|---|---|---|
| 2,984,774 | 5/1961 | Race | 174/16 R |
| 3,462,553 | 8/1969 | Spranger | 317/100 |
| 3,778,551 | 12/1973 | Grodinsky | 317/100 |

*Primary Examiner*—Gerald P. Tolin
*Attorney, Agent, or Firm*—McCaleb, Lucas & Brugman

[57] ABSTRACT

A solid state amplifier for automatic coin-controlled phonographs mounted within a dust sealed cabinet and comprising a cast aluminum chassis having one wall formed with heat convecting fins mounted over an opening in a rear wall of the cabinet such that the convector fins thereon are exposed to atmosphere exteriorly of the sealed cabinet and having heat emitting power transistors of the amplifier supported in thermally sealed chambers between a heat sink support for the transistors and the interior of the finned convector wall of the chassis to provide efficient convection cooling of the transistors while preserving the sealed integrity of the cabinet's interior.

4 Claims, 4 Drawing Figures

CABINET AND HEAT SINK FOR AMPLIFIER COMPONENTS

BACKGROUND OF THE INVENTION

This invention relates generally to automatic phonographs and, more particularly, to improved means for cooling power amplifiers employed therein.

In the modern-day coin-controlled phonograph, more commonly termed a "jukebox", it is prevalent to utilize solid state amplifiers employing one or more power transistors and like solid state devices. In order to maintain such solid state devices in satisfactory operating condition, it is paramount that the ambient temperature thereof be maintained at relatively low levels and thus it is necessary to provide an effective cooling system therefor. In the past, cooling the interior of such phonographs has generally entailed the provision of vent openings in the phonograph cabinet through which air is forced, usually by a circulating fan. Such cabinet openings and forced air circulating systems, however, have historically proven to be of major concern to the manufacturer and operator because of the inability to maintain the atmosphere within the phonograph cabinet free of dust and moisture. As a result, the operating mechanisms, motors and electrical or electronic components have become coated with unwanted dust productive of fire hazards, short circuiting and increased maintenance costs. Of additional importance is the inability to prevent customers and vandals from pouring liquids into the interior of the cabinet or inserting rods or wires through the cabinet openings, leading to serious damage and breakdown of the mechanisms. Thus, for some time it has been the desire of jukebox manufacturers to provide a completely sealed cabinet to avoid any access to the interior thereof except by authorized personnel. However strong this desire, the practicalities of maintaining a completely sealed cabinet's interior temperatures at low operating levels have militated against a satisfactory solution to this problem. It is to this problem of providing an improved cooling system, for the high temperature producing components of an amplifier carried within a sealed cabinet of an automatic phonograph, that the present invention is directed.

In brief, the present invention concerns an improved cooling system for an amplifier employing solid state components in which the base of chassis of the amplifier is formed as a heat transmitting metal casting, preferably devised with an exterior surface having a plurality of convector cooling fins. Such convector surface of the chassis is mounted so as to extend or be exposed to the exterior atmosphere surrounding the phonograph cabinet via an opening, preferably in the rear wall thereof, while the heat emitting components of the amplifier are mounted adjacent to such convector wall of the chassis to insure rapid dissipation of the heat via the radiation convection capabilities of the cast metal base. More specifically, the power transistors of the solid state amplifier are sealed in interior chambers and mounted on heat sink bases which effectively transmit heat to the base of the chassis for eventual dissipation exteriorly of the cabinet while preserving the sealed integrity thereof. In conjunction with the specifics of the improved amplifier, construction and mounting, walls of the phonograph cabinet are preferably of sheet metal so that other heat transmitting or emitting sources of the phonograph mechanisms may dissipate their heat through the walls of the cabinet. The power transformers associated with the amplifier are also mounted through the rear wall of the cabinet and shielded by an overcovering metal casing to be fully protected from unwanted interference by liquids or probing wires, tools and the like. All in all, when the cabinet is sealed or closed, the interior thereof is for all intents and purposes sealed against the entry of dust and dirt while the operating temperatures therewithin are maintained at satisfactory operating levels.

An important object of the present invention is to provide an improved system for cooling power amplifiers utilized with the sound systems of automatic phonographs and the like.

Still another object of this invention is to provide an improved automatic phonograph having a dust sealed cabinet and a convection cooling system for maintaining the operating temperatures of a power amplifier mounted within the cabinet at satisfactory operating levels.

Still another and more specific object of this invention is to provide an improved amplifier employing a cast metal convection cooled chassis whereby solid state elements employed therein are maintained at satisfactory operating temperatures within a sealed atmosphere.

Having thus described the present invention, the above and further objects, features and advantages thereof will be recognized by those familiar with the art from the following detailed description of a preferred embodiment thereof illustrated in the accompanying drawings and representing the best mode presently contemplated so as to enable those skilled in this art to understand and practice this invention.

Figure 1:
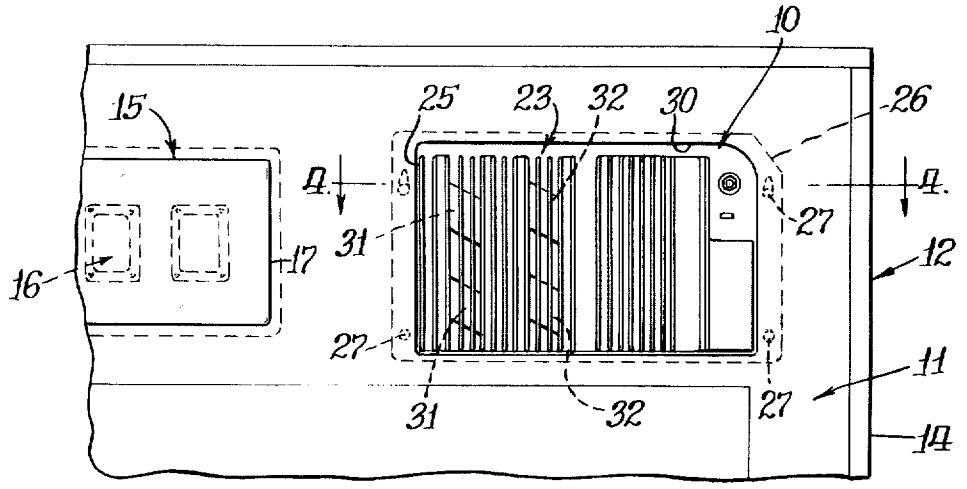
FIG. 1 is a partial rear elevational view of an automatic phonograph cabinet illustrating the assembly of a convection cooled amplifier therewith.
Figures 2, 3:
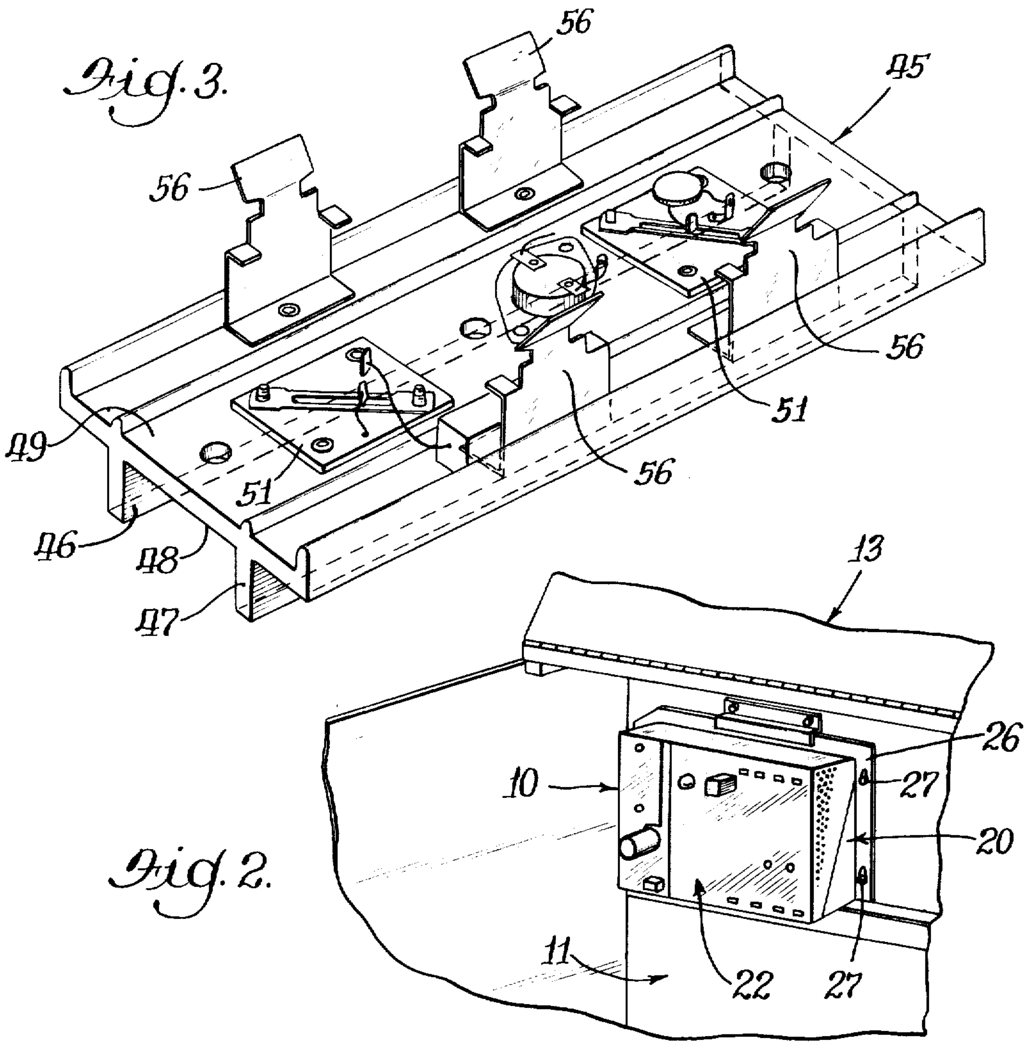
FIG. 2 is a partial perspective view of the interior of the cabinet illustrated in FIG. 1 and depicting the mounted arrangement of the amplifier therein.
FIG. 3 is a perspective view of a typical heat sink employed with the power transistors of a convection cooled amplifier according to this invention.

Turning now to the particulars of the preferred embodiment illustrated in the accompanying drawings, specific reference is made to FIGS. 1 and 2 of the drawings. As shown in FIG. 1, a convection cooled amplifier, indicated generally by numeral 10 in accordance with the present invention, is mounted in the rear wall 11 of an automatic phonograph housing or cabinet 12; the latter comprising the usual top, side, front, back and bottom walls to enclose an interior spacing in which the various operating components of the automatic phonograph are mounted. Normal access to the interior of the cabinet is provided via a hinged glass front panel wall 13 (see FIG. 2) or a combination of hinged front and top wall panels according to known practice. Importantly, for the successful operation of the convection cooling system of this invention, some of the walls such as the side walls 14 of the cabinet 12 preferably are of metal, such as aluminum, capable of good heat conductivity. It is also important to the concept and intention of this invention that the cabinet 12, when in a closed state, be free of any openings for entry of damaging air and dust to its sealed interior. While the various phonograph components in fact generate a certain amount of heat during their operation, such as the motors for the record magazine, the selector and turntable mechanisms, the heat conductive metal walls of the cabinet and, in certain instances, a glass top wall through which to view the program listings, are effective to dissipate the heat emitting from these components.

The present invention is especially concerned with the cooling of the sound system amplifier 10 and the ensuing description will therefore be directed to that aspect of the improved system for cooling the interior of the phonograph cabinet.

Before entering into the specific description of the amplifier 10, it will be recognized from FIG. 1 in particular that one of the other major heat generating sources of a phonograph comprises the power pack 15 for driving the amplifier which generally includes one or more power transformers 16 mounted adjacent the amplifier 10. Such transformers are mounted to extend through rear wall 11 of the cabinet, but are protectively enclosed by housing 17 which projects through an opening therefor in the rear wall 11 and is sealed with the cabinet by mounting flange 18. Heat generated by the transformers is suitably dissipated through the metal walls of the housing 17, the interior of which may also communicate by suitable vent openings with the interior of the phonograph cabinet 12 for added cooling.

Figure 4:
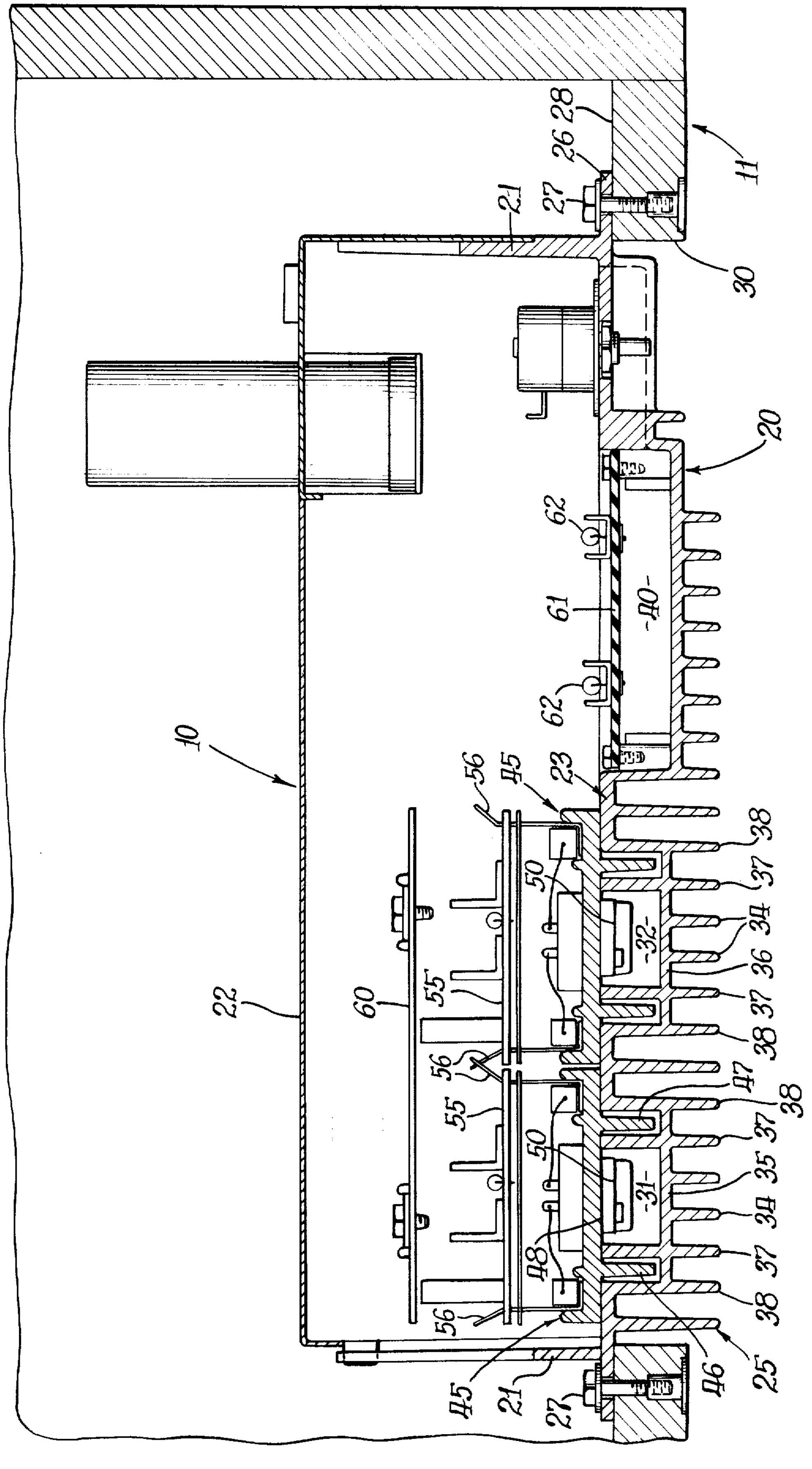
FIG. 4 is a cross sectional view taken substantially along vantage line 4-4 of FIG. 1 and looking in the direction of the arrows thereon, to illustrate the convection cooling system employed with the amplifier.

As best shown in FIGS. 1 and 4 of the drawings, amplifier 10 comprises a cast metal base or chassis 20 for supporting the various electronic components associated with the amplifier 10. More specifically, the chassis 20 has a pair of angularly related or sloping side walls 21, 21 (see FIG. 2) adapted to interfit with a perforated cover 22 to provide a generally rectangular, box-like housing. The major wall of the chassis 20 comprising a base wall generally designated 23 in FIG. 4 which is formed with a plurality of outwardly projecting convector fins 25 and is bordered by a planar mounting flange portion 26 adapted to receive mounting screws 27 for fastening the same securely to the inside face 28 of rear wall 11 of the phonograph cabinet. Sealing mastic or caulking compound may be utilized between flange 26 and cabinet wall 28 to insure an air and dust free seal therebetween. The rearwardly projecting fins 25 of the base wall 23 extend through an opening 30 formed for that purpose in the rear wall 11 of the cabinet as shown specifically in FIG. 1.

It will be particularly noted that the cast formation of the base wall 23 includes four open top wells 31, 31 and 32, 32 which extend rearwardly or outwardly of the major base portion 33 of wall 23. Because of the formation of wells 31 and 32, the convector fins 34 projecting from the outer faces of the bottom walls 35 and 36 thereof, respectively, are somewhat foreshortened from the major cast finned members 25.

In addition, such bottom walls 35 and 36 also extend laterally between adjacent pairs of ribs 37 and 38 along opposite sides thereof to provide elongated channels, the purpose of which will appear presently. An additional larger, rectangular shaped, open-top well 40 is also formed to one side of the four wells 31 and 32 for purposes which will appear presently.

With specific reference now to FIG. 3 of the drawings, a heat sink platform 45 is therein illustrated as comprising an extruded aluminum section of generally elongated rectangular configuration having a pair of parallel spaced feet or ribs 46 and 47 projecting outwardly of the bottom face 48 of base wall 49 thereof. Among other electronic components, the heat sink 45 is adapted to mount a pair of power transistors 50, 50 on the under side of wall 49 (see FIG. 4) so that the connecting pins for such transistors extend upwardly through the wall 49 and insulating boards 51, 51 for connection with other electronic components of the amplifier. From FIG. 4 in particular, it will be recognized that there are two such heat sink assemblies 45, 45 illustrated, each carrying a pair of power transistors 50 on the bottom side thereof and each assembled with the cast chassis 20 in such a fashion that each of the transistors 50 projects into one of the wells 31 or 32 thereof while the elongated feet or ribs 46 and 47 of the heat sink 45 extend into the channel spaces between the adjacent pairs of ribs 37 and 38 on opposite sides of the transistor wells 31 and 32. The heat sinks 45 are suitably fastened to the chassis 23 as by screws or similar fasteners and preferably a heat conducting sealant, such as silicone grease, is provided at the inner face between the bottom wall 48 of the heat sink and the inside face of the base wall 23 to provide an intimate heat conductive seal therebetween.

With this arrangement the various electronic components mounted on the heat sinks 45 and more particularly, the power transistor 50, 50 thereon emit their heat to the heat sink 45 and chassis wall 23 which conduct to the surrounding metal of the convector wall 23 of the chassis to provide an efficient cooling system therefor.

As further illustrated in FIG. 4, a pair of capacitor carrying boards 55, 55 may be mounted in spaced parallelism over the top of the transistors 50 and heat sinks 45, being secured thereto as by mounting clips 56, 56 (see FIG. 3) or the like. A heat shield of insulating material, indicated generally at 60, also is provided to extend over the assembled capacitor boards 55 and heat sinks 45 so as to reflectively confine the heat emissions of such components for dissipation through the heat sinks 45 and the intimate relation of the latter with the cast metal base wall of the chassis 20.

In a somewhat similar fashion, the secondary well 40, to the right of the transistor wells 31 and 32, as viewed in FIG. 4, is generally overcovered by an insulated capacitor board 61 carrying a plurality of capacitors and resistors 62, or the like. Additional components of the amplifiers circuitry (not shown) are adapted to be carried on the inside of the cover member 22 or at other convenient locations on chassis 20.

Principally, it will be recognized that through the teaching of providing a primary heat sink for each of the power transistors 50 and confining such transistors in individual enclosed wells, having intimate heat conductive relationship with the cast metal chassis having convecting ribs outwardly of the cabinet's exterior, provides an effective and efficient system for cooling the power transistors in accordance with that objective of this invention.

It further will be appreciated that by mounting the amplifier 10 and more specifically the base 23 thereof over opening 30 in the rear wall of the phonograph cabinet, effectively preserves the sealed integrity of that cabinet insofar as the cooling requirements for the amplifier are concerned. In a similar fashion, mounting of the power pack 15 and its heat emitting transformers 16 in the manner heretofore described, again preserves the sealed integrity of the cabinet as intended. With this arrangement, it has been found that a phonograph cabinet may be securely sealed against dust and outside air entry while the heat generated by the various electrical and electronic components thereof is dissipating through the metal walls of the cabinet and, more specifically with regard to the amplifier, through the convector chassis of the amplifier as above described.

From the foregoing description, it is believed that those familiar with the art will readily recognize and appreciate the novel advancement presented by the present invention and will readily understand that while the particular preferred embodiment is herein set forth in conjunction with an illustrative solid state amplifier, the principles and concepts involved therein are susceptible to variation and substitution of equivalents without necessarily departing from the conceptual spirit and scope of the described invention as defined in the hereinafter appended claims.

The embodiments of the invention in which an exclusive property or privilege is claimed are defined as follows:

1. In an automatic coin-operated phonograph: a dust sealed cabinet for enclosing the working components of the phonograph, an electronic amplifier mounted within said cabinet and comprising a cast metal chassis having a major base wall formed with a plurality of spaced heat convector fins extending outwardly of one face thereof, said base wall having plural spaced wells opening inwardly of the opposite face thereof; means mounting said chassis over an opening in one wall of said cabinet such that said fins are exposed to atmosphere exteriorly of the cabinet while maintaining the sealed integrity of the latter's interior, thermally conductive heat sink means supporting electronic components mounted on said chassis in thermal conductive relation with said base wall to enclose said wells therein, and plural power transistor means supported on said heat sink means, one enclosed within each of said wells, whereby the heat emission of said transistor means is effectively dissipated to the exterior of the cabinet by said chassis and convector fins.

2. The combination of claim 1 wherein said heat sink means comprises a plurality of individual thermally conductive elongated metal members, each formed with a pair of elongated parallel spaced ribs extending outwardly of one wall thereof; said base wall having parallel spaced channels opening inwardly of its said opposite face adjacent said wells and receiving said ribs whereby to transmit heat to said base wall and convector fins.

3. The combination of claim 1 wherein said means for mounting said chassis over said opening comprises a mounting flange bordering said base wall and engaged with said one wall of the cabinet along the periphery of said opening thereon.

4. The combination of claim 1 and heat shield means mounted over said heat sink means for reflectively transmitting heat to said chassis.

* * * * *